(12) United States Patent
Wang et al.

(10) Patent No.: US 7,137,744 B2
(45) Date of Patent: Nov. 21, 2006

(54) FIBER OPTIC TRANSCEIVER MODULE WITH RIGID AND FLEXIBLE CIRCUIT BOARDS

(75) Inventors: Charles Xiaozhong Wang, Sunnyvale, CA (US); Edmond Lau, Sunnyvale, CA (US)

(73) Assignee: Emcore Corporation, Somerset, NJ (US)

( * ) Notice: Subject to any disclaimer, the term of this patent is extended or adjusted under 35 U.S.C. 154(b) by 75 days.

(21) Appl. No.: 10/866,265

(22) Filed: Jun. 14, 2004

(65) Prior Publication Data

US 2005/0276547 A1   Dec. 15, 2005

(51) Int. Cl.
*G02B 6/36* (2006.01)
(52) U.S. Cl. .............................. 385/89; 385/88; 385/92
(58) Field of Classification Search ................ 385/89
See application file for complete search history.

(56) References Cited

U.S. PATENT DOCUMENTS 6,164,838 A * 12/2000 Maehara et al. ............. 385/92
6,702,480 B1 * 3/2004 Sparacino ..................... 385/88
2003/0053762 A1 * 3/2003 Cheng et al. .................. 385/88
2004/0047637 A1 * 3/2004 Wang et al. ................. 398/164

* cited by examiner

*Primary Examiner*—Frank G. Font
*Assistant Examiner*—Ryan Lepisto

(57) ABSTRACT

An optical transceiver for converting and coupling an information-containing electrical signal with an optical fiber includes a housing and coupled rigid and flex printed circuit boards. The housing includes a fiber optic connector adapted for coupling with an external optical fiber for transmitting and/or receiving an optical communications signal. The rigid printed circuit board is within the housing and includes an electrical connector for coupling with an external electrical cable or information system device, and for transmitting and/or receiving an information-containing electrical communications signal. A first interface connector is for receiving or transferring the electrical signal. A flexible printed circuit board is also within the housing and coupled to the rigid printed circuit board, including a second interface connector for mating with the first interface connector, and transmitting or receiving the electrical signal to or from the rigid printed circuit board. An electro-optical subassembly on the flex board is for converting between an electrical signal and a modulated optical signal. The flex board is adapted for coupling to the fiber optic connector.

14 Claims, 12 Drawing Sheets

FIBER OPTIC TRANSCEIVER MODULE WITH RIGID AND FLEXIBLE CIRCUIT BOARDS

BACKGROUND

1. Field of the Invention

The invention relates to electro-optic conversion modules, and particularly to connecting rigid and flex circuit boards in parallel optical media converters.

2. Description of the Related Art

The speed of computers and the data transfer between them is ever increasing. Optical data transmission techniques have been developed to provide high capacity signal transmission without many of the physical limitations for electrical cables. Fiber-optic cables have advantageous transmission characteristics, which are utilized with opto-electronic devices such as fiber-optic transceivers by converting electrical signals into optical signals and vice versa at the ends of the fiber-optic cables.

The typical hardware architecture of computers involves circuit boards that are perpendicularly connected with a pin edge or a pin array in lengthy multi-pin connectors, which are laterally arrayed on a mother board. That way, the circuit boards are oriented parallel with their receptacle end showing towards the back end of the computer. The designated ends have mounting sites that carry the cable connectors. The cable connectors typically reach through open slots in the back face of the computer chassis such that the communication cables can be connected from outside.

The core of a fiber optic transceiver is an optoelectronic semiconductor-based module. The transceiver receives and emits light beams perpendicular to its top surface. Since the fiber cable is connected normal to the computer back face as other communication cables, the planar optoelectronic semiconductor preferably has a first distinct orientation which is perpendicular oriented to the circuit board.

To extend the application of the fiber optic transceiver for mass-produced, low-cost computers, it is desired for the individual components to be economical to fabricate, and for the assembly of the fiber optic transceiver to be simple and reliable at the same time. A number of attempts have been made to integrate some of these design considerations and others into a feasible opto-electronic transceiver module package. For example, U.S. Pat. No. 6,583,902, which is assigned to the same assignee as the present invention and is hereby incorporated by reference, describes an advantageous opto-electronic transceiver module package, as do others of the references cited and incorporated by reference below.

The optical transceiver of the present invention preferably comprises a parallel optical module that can convert four lane InfiniBand®, Cx4, four port or four channel signals into parallel optical signals. It can preferably interface with an industry standard media dependent interface (MDI) connector on the electrical side. In an MDI connector interface embodiment, the PCB thickness on the electrical side would be preferably about 40 mils. Thus, it is desired to have a rigid board design for making the electrical connection.

The optical transceiver of the present invention preferably can interface also optically interface according to an industry standard manufacturing production order (MPO), which is configured to be in parallel with a PCB surface. The parallel optical module generally uses a VCSEL array for its low cost. The VCSELs emit the light from their top surfaces. It is recognized in the present invention that a flex PCB may be advantageously used to turn the optical axis, which is normal to the plane of the board when VCSELs are used, into parallel with the rigid PCB surface. That is, the plane of the electrical connection end of the board is preferably orthogonal to the plane of the fiber optic coupling end of the board. Thus, a rigid board and a flex board are preferably both used, and it is therefore desired to have a way to couple them together mechanically, so that signals can be transferred between them.

One method would be to design a rigid-flex board such as that illustrated at FIG. 9, which is recognized by the inventors as a schematic illustration in accordance with an alternative embodiment of the invention. FIG. 9 shows a rigid-flex board, which is a single board that is rigid on one end 52 and that is around 40 mils thick for connecting with a standard MDI connector. The other end 54 of the board is flexible so that it can have an approximately 90° contour to cause the output of the VCSEL array to be parallel to the rigid board, and thus the plane of the end of the board containing the VCSEL array would itself be orthogonal to the rigid board. The interface coupling 56 would involve some form of adhesive or bonding material that adheres to both the rigid and flex materials, or two such materials that adhere to themselves and with each of the rigid and flex materials.

This concept illustrated at FIG. 9 is understandably expensive due to the difficulty in making the board, i.e., it tends to have undesirably long fab cycles. Details regarding implementation of this alternative approach are understood by those skilled in the art, and rigid-to-flex manufacturing may be accordingly obtained from HET, Inc. of Victoria, Minn. or Flex Interconnect Technologies, Inc. of Milipitas, Calif. Moreover, the resulting boards are also prone to have reliability issues. For example, the mechanical or signal coupling at the interface 56 can break down. Therefore, although FIG. 9 schematically illustrates an alternative embodiment that would work to implement rigid-to-flex interfacing to realize an optical transceiver in accordance with the invention, a more advantageous embodiment is described below in the Detailed Description of the Preferred Embodiments.

SUMMARY OF THE INVENTION

In view of the above, an optical transceiver is provided for converting and coupling an information-containing electrical signal with an optical fiber including a housing and rigid and flex printed circuit boards. The housing includes a fiber optic connector adapted for coupling with an external optical fiber for transmitting and/or receiving an optical communications signal. The rigid printed circuit board is within the housing and includes an electrical connector for coupling with an external electrical cable or information system device, and for transmitting and/or receiving an information-containing electrical communications signal. A first interface connector is for receiving or transferring the electrical signal. A flexible printed circuit board is also within the housing and couled to the rigid printed circuit board, including a second interface connector for mating with the first interface connector, and transmitting or receiving the electrical signal to or from the rigid printed circuit board. An electro-optical subassembly on the flex board is for converting between an electrical signal and a modulated optical signal. The flex board is adapted for coupling to the fiber optic connector.

In another aspect of the invention, an optical transceiver is provided for converting and coupling an information-containing electrical signal with an optical fiber including a housing, a rigid printed circuit board, a flexible printed circuit board and an interface connector. The housing includes a fiber optic connector adapted for coupling with an external optical fiber for transmitting and/or receiving optical communications signals. A rigid printed circuit board is in the housing and includes an electrical connector for coupling with an external electrical cable and/or information system device, and for transmitting and/or receiving an information-containing electrical communications signal. The first interface connector is coupled with the rigid printed circuit board for receiving or transferring the electrical signal. A flexible printed circuit board is also in the housing and coupled to the rigid printed circuit board via the first interface connector for transmitting and/or receiving electrical signals to/from the rigid printed circuit board. The flexible board includes an electro-optical subassembly for converting between the electrical signals and modulated optical signals. The flex board is adapted for coupling to the fiber optic connector.

In a further aspect of the invention, an optical transceiver module is provided for converting and coupling an information-containing electrical signal with an optical fiber. The module includes rigid and printed circuit boards and a rigid-to-flex board interface connector. The rigid board is for electrically coupling with an electrical signal input/output connection. The flex board is for optical coupling with an optical signal input/output connection. The rigid-to-flex board interface connector is mechanically coupled with the rigid board and with the flex board such that information signals are transferable between them.

With any of the above aspect of the invention, the electrical signal input/output connection may be a clip connector and/or a media dependent interface (MDI) connector. The first interface connector or rigid-to-flex interface connector may be further for signal coupling with and transferring signals between each of the rigid and flex boards. As with the first two aspects, a housing may include an optical connector for a fiber optic cable, and the optical coupling of the flex board may include coupling with the optical connector of the housing. Top and bottom mechanical support blocks may be used, wherein the first interface connector or the rigid-to-flex interface connector may include two or more apertures for receiving corresponding bolts. When the rigid and flex boards are coupled together, the interface may be disposed between them, and the rigid and flex boards and the interface may be all disposed between the top and bottom mechanical couplings, and bolted together. The information signals that are transferable between the rigid and flex boards are preferably electrical signals, and so the flex board includes an electro-optic converter thereon.

DETAILED DESCRIPTION OF THE PREFERRED EMBODIMENTS

One or more preferred embodiments of the invention will now be described in detail with reference to the Figures. Assembly configurations 1a, 1b or housings 1a, 1b (see FIGS. 1 and 4) are first described in accordance with preferred embodiments with reference to FIGS. 1–8. A housing such as one of these exemplary housings 1a, 1b preferably contain the optical transceiver of the invention and/or in combination the optical transceiver and housing comprise the invention. An optical transceiver in accordance with a preferred embodiment is particularly described with reference to FIGS. 10–13.

Figure 1:
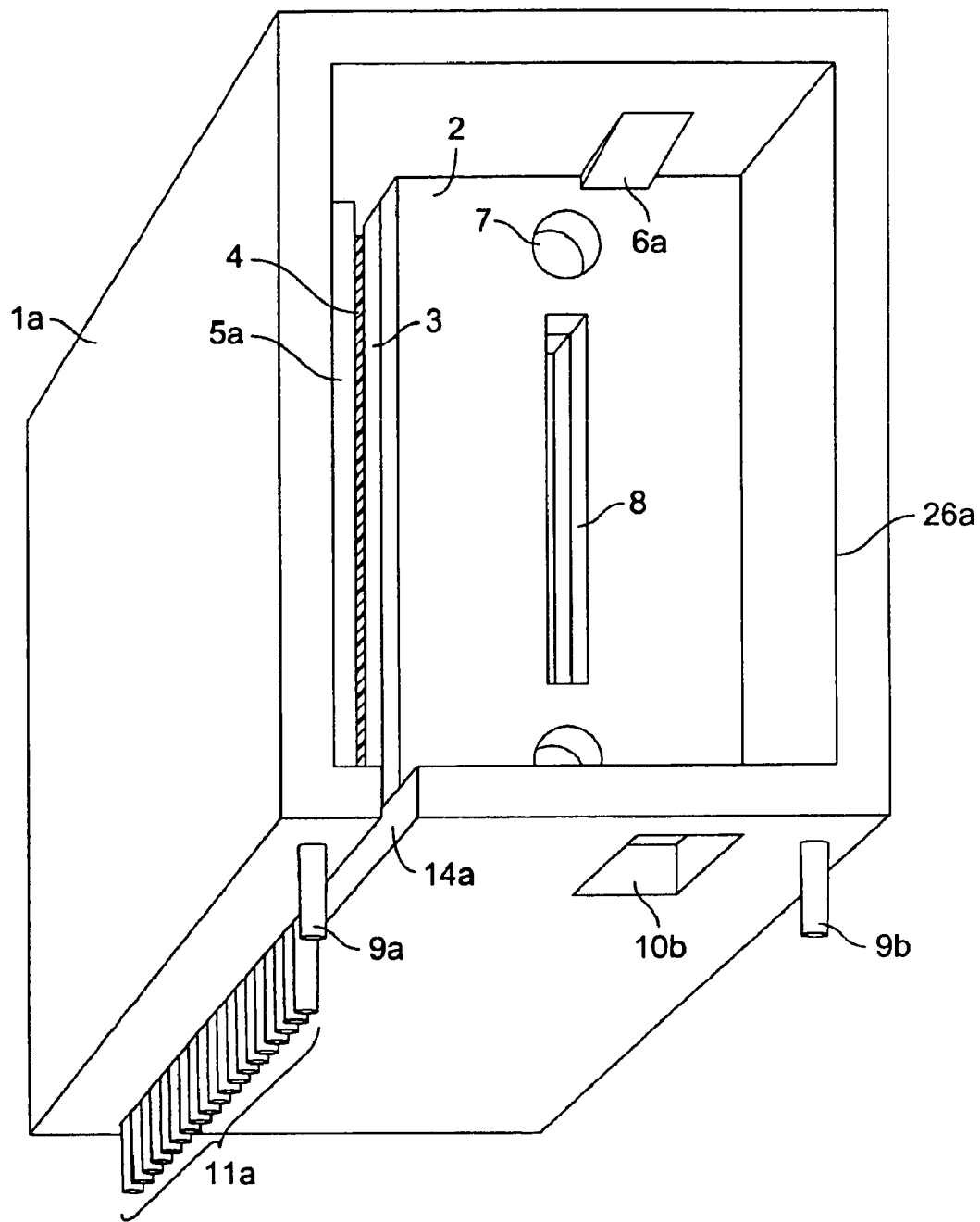
FIG. 1 shows a first perspective view onto the cable adapter side of an exemplary first assembly configuration.

FIG. 1 shows a perspective view of a first assembly configuration with a first subassembly 27a (see FIGS. 2 and 3) being connected to the first transceiver board 5a along a perpendicular direction. The first subassembly 27a comprises typically the adapter module 2, the lens module 3 and the duplex transceiver module 4. The adapter module 2 has precision alignment features 7 that are preferably cylindrical cavities symmetrical and placed in parallel to the beam tunnel 8. The alignment features 7 capture corresponding alignment features of a cable plug (not shown) that is connected to the device during its operation thereby to ensure the precise alignment of the optical fiber end(s) when positioned in front of the beam tunnel 8.

The first transceiver board 5a which in combination with the connected first subassembly 27a define a rigid core unit 28 (see FIG. 3), is placed inside the first housing 1a through the first receptacle contour 26a. First and second snapping features 6a and 6b (see FIG. 2) secure the rigid core unit 28 in the assembled position.

The first and second snapping features 6a, 6b are typically conventional snap hooks that are released from the surrounding housing structure by the housing separations 10b.

Figure 4:
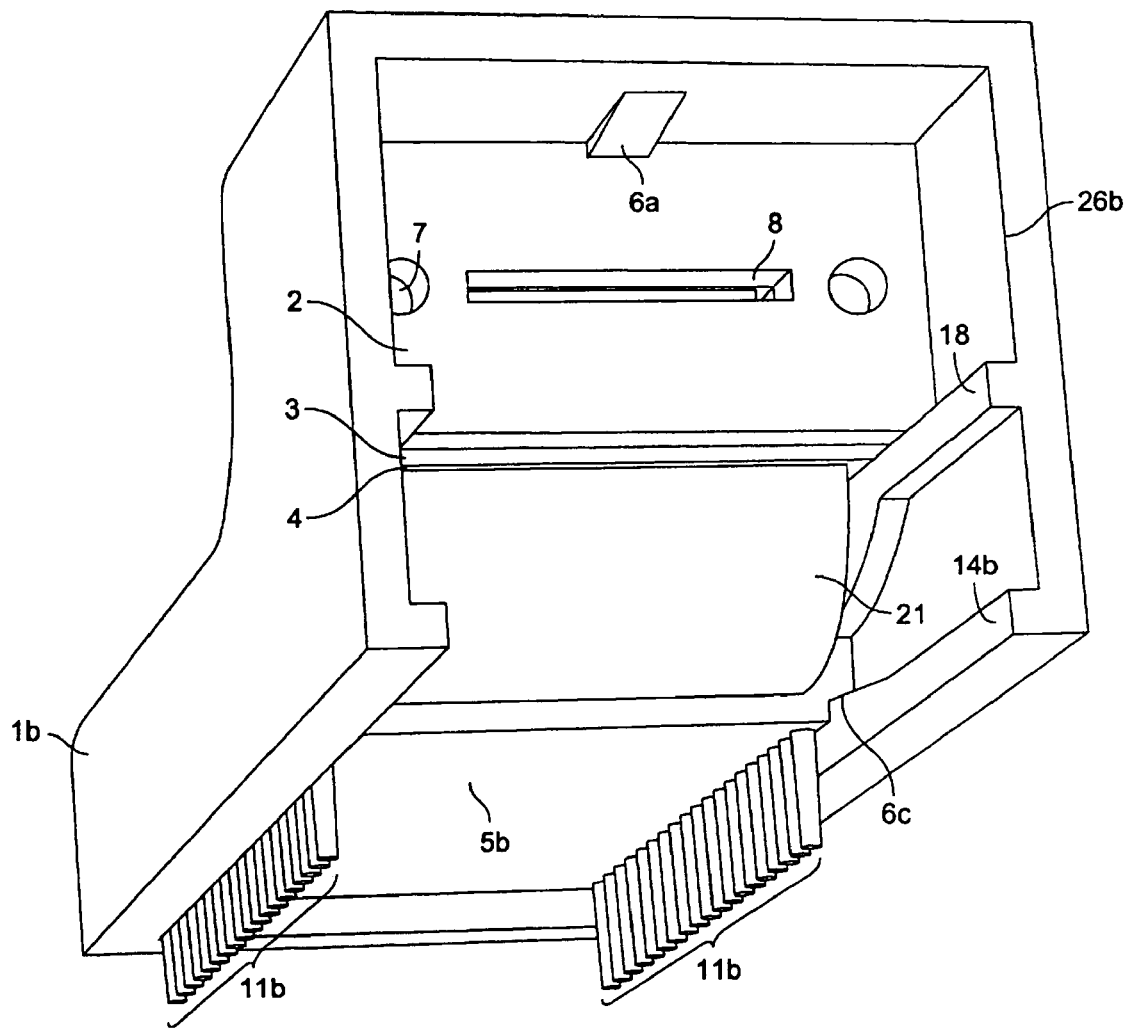
FIG. 4 shows a first perspective view onto the cable adapter side of an exemplary second assembly configuration.

The first and second subassembly 27a and 27b (see FIGS. 5 and 7) are preferably stacked together in an aligned and loose formation and held together respectively inside the first and second housing 1a and 1b (see FIG. 4 and FIG. 5) by the first snapping features 6a, 6b and 6c (see FIG. 4).

A first conventional solder pin array 11a extends laterally from the bottom edge of the first transceiver board 5a and through a first solder pin slot 14a of the first housing 1a.

The first housing 1a features also supporting solder pins 9a, 9b, which define together with the first solder pin array 11a a two dimensional connection. As a result, the first housing 1a is directly mechanically supported at the mounting site of the transceiver device.

Hence, bending loads imposed from the fiber cable are captured by the first receptacle contour 26a such that the subassembly and the rigid core unit 28 remain free of mechanical stress.

The rigid core unit 28 has preferably an outside contour smaller than or equal to the receptacle contour 26a. The rigid core unit 28 is preferably assembled through the receptacle contour 26a inside the first housing 1a.

The first solder pin slot 14a is open on the side of the receptacle contour 26a so as to enable the first solder pin array 11a to slide during the assembly process into its final position.

The first snapping feature 6a is preferably in opposing position to the second snapping feature 6b (see FIG. 2), which is not visible because of the perspective view in FIG. 1. The second feature 6b is at a corresponding location of the housing separation 10. The first snapping feature 6a has also a corresponding housing separation 10 (see FIG. 6).

It is appreciated, that the bottom side of the first and second housing 1a and 1b (see FIGS. 4, 5 and 6) may be a separate part, which allows an assembly of the respective rigid and flexible core units 28 and 29 (see FIG. 7) through the bottom of the respective first and second housing 1a and 1b.

Because of the vertical position of the first transceiver board 5a inside the first housing 1a, the first assembly configuration allows a narrow width of the first housing 1a. Hence, typical mounting sites for first assembly configurations consume little length along the edge of a printed circuit board.

Figure 2:
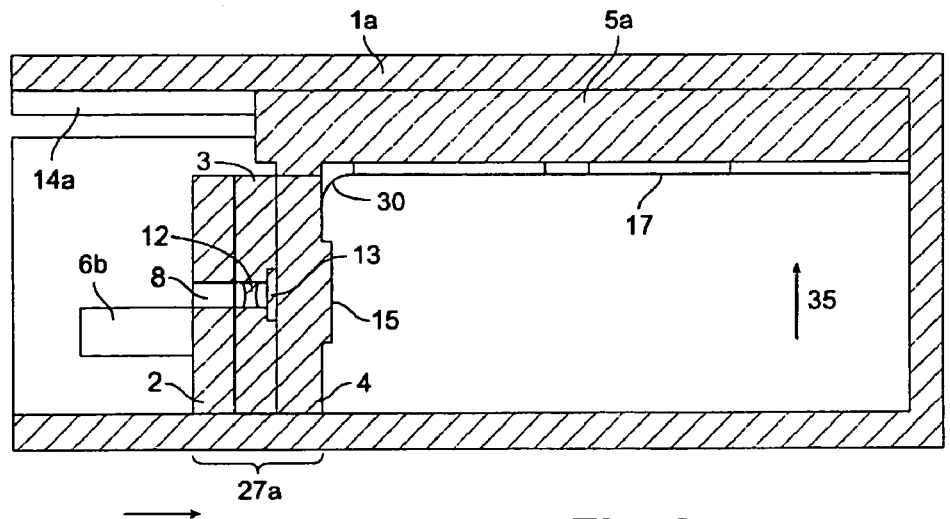
FIG. 2 shows a sectional top view of an exemplary first assembly configuration.

FIG. 2 shows a sectional top view of an exemplary first assembly configuration. The first subassembly is shown with the duplex transceiver module 4 being connected to the first transceiver board 5a.

The duplex transceiver module 4 has an optoelectronic circuitry 13 on its front side and an optional heat dissipation back side 15.

The lens module 3 carries the conventional lenses 12.

A first internal shoulder contour 30a supports the rigid core unit 28.

Figure 3:
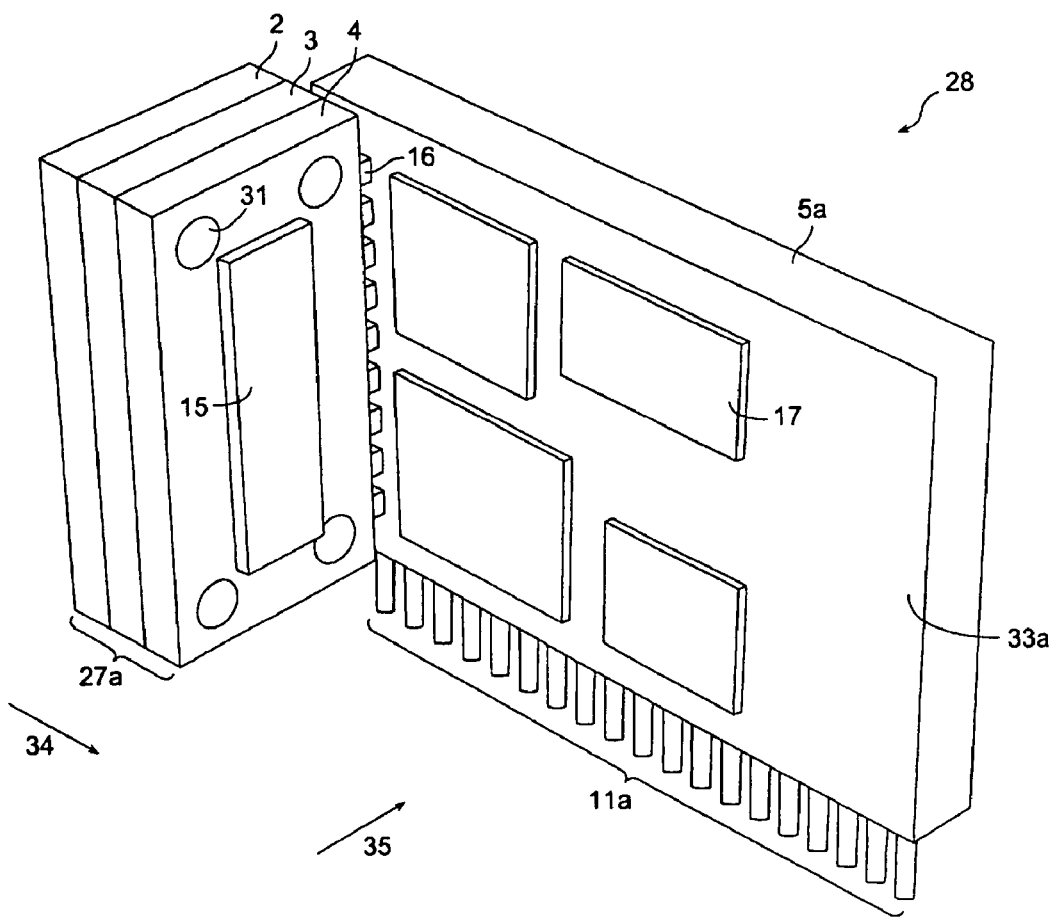
FIG. 3 shows a second perspective view of an exemplary rigid core unit according to the first assembly configuration.

FIG. 3 shows a second perspective view of an exemplary rigid core unit 28 according to the first assembly configuration. The first transceiver board 5a has conventional contact terminals 16 where the duplex transceiver module 4 is preferably solder bonded to provide simultaneously a mechanical connection and a number of electrical connections.

On the back side of the duplex transceiver module 4 are the alignment features 31, shown in FIG. 3, which have a corresponding shape on the front side. The alignment features 31 are placed preferably in identical shape and position on the lens module 3, the multi-channel module 19 (see FIGS. 5 and 7), the adapter module 2 and the heat sink module 22 (see FIGS. 5, 6 and 7) such that they can be assembled in different combinations.

The adapter module 2 has the alignment feature 31 only on the back side, since it is placed at the very front of the first and second subassembly 27a, 27b. The heat sink module 22 has the alignment feature 31 only on the front side, since it is placed at the very back of the second subassembly 27b. The uniform shape and position of the alignment features 31 allow a number of functional configurations and designs of each individual module and a free combination between them. As a result, transceiver devices of the invention can be manufactured in a wide variety out of a low number of varying components.

It is appreciated, that the alignment features 31 may incorporate additional functional elements like alignment profiles that protrude through all individual modules.

The first and second transceiver boards 5a and 5b (see FIGS. 5 and 7) have conventional chips 17, which are connected to the contact terminals 16 and the first and second pin arrays 11a and 11b (see FIGS. 4 and 7) to perform standard logical operations.

FIG. 4 shows a first perspective view onto the cable adapter side of an exemplary second assembly configuration.

A flexible core unit 29 (see FIG. 7) is preferably assembled through the second receptacle contour 26b inside the second housing 1b and along the subassembly alignment features 18 and the second solder pin slot 14b. The flexible core unit 29 is held in place by the first and third snapping features 6a, and 6c.

The second subassembly 27b is electrically connected to the second transceiver board 5b via a standard flex cable band 21.

A second solder pin array 11b protrudes perpendicular out of the second transceiver board 5b and forms a two dimensional mechanical and electrical connection at the mounting site.

It is appreciated that the second housing 1b may have supporting solder pins 9a and 9b.

The subassembly alignment feature 18 provides additional support for the second subassembly 27b to compensate the flexibility between it and the second transceiver board 5b.

Figure 5:
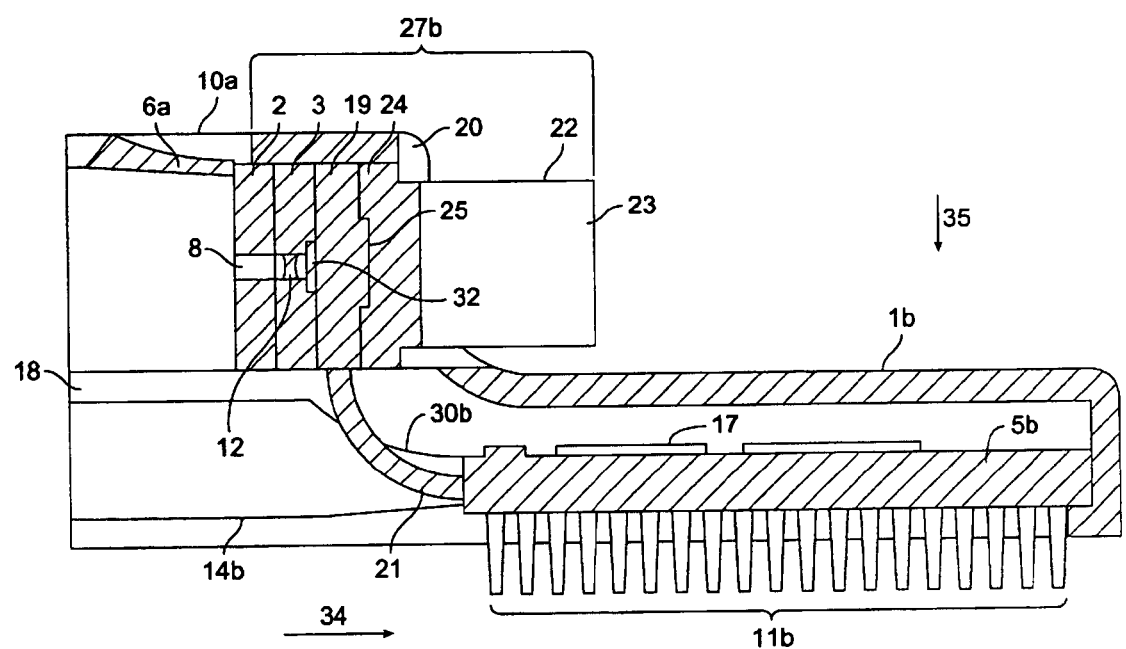
FIG. 5 shows a sectional top view of an exemplary second assembly configuration.

FIG. 5 shows a sectional top view of an exemplary second assembly configuration.

The second subassembly 27b has a multi-channel module 19 with conventional multiple optoelectronic devices 32 disposed thereon. The lens module 3 with its lenses 12 and the adapter module 2 with its beam tunnel 8 are configured correspondingly.

The high density of the multiple optoelectronic devices 32 typically generates excessive heat, which is transmitted via the heat exchange area 25 to the adjacent heat sink module 22. The heat sink module 22 has a heat sink base 24 that contacts the heat exchange area 25 to drain the heat there from and to transmit it to the cooling ribs 23. The second housing 1b has a stepped shape and an opening 20 such that the cooling ribs 23 are accessible for a cooling air stream.

The flex cable band 21 provides a high lead density to transmit the signals of each of the multi-channel module 19 onto the second transceiver board 5b. In addition, it mechanically de-couples the second subassembly 27b from the second transceiver board 5b. Hence, forces applied for instance during the connecting of a fiber cable or during the assembly of the flexible core unit 29 cannot stress or harm the connection between the multi-channel module 19 and the second transceiver board 5b.

It is appreciated that the flex cable band 21 may be used to connect the duplex transceiver module 4 to the first transceiver board 5a in a flexible connection.

It is appreciated that the second transceiver board 5b may have a first solder pin array 11a laterally extended. Hence, the invention in its second assembly configuration may be attached at the mounting site with the second transceiver board 5b in perpendicular position to the mounting site.

Figure 6:
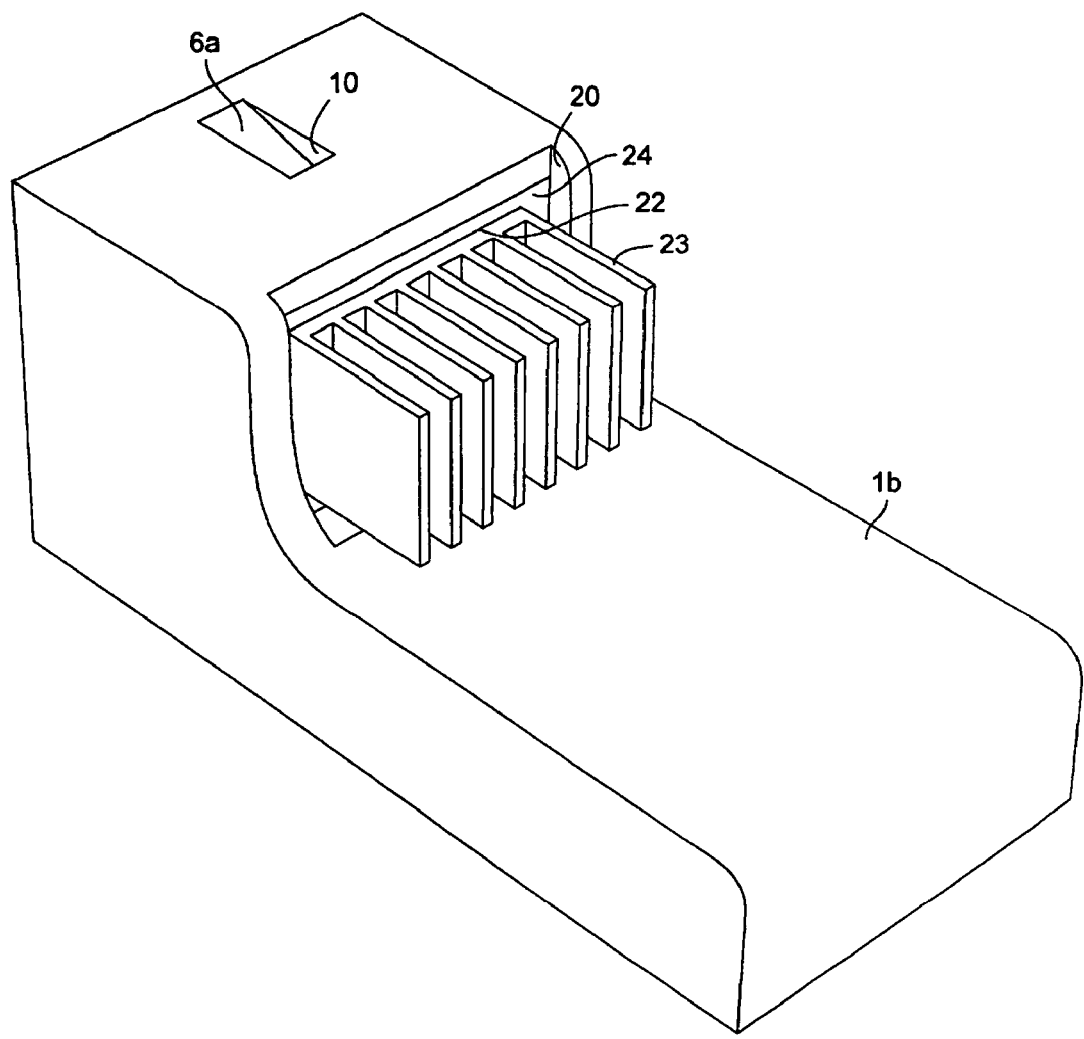
FIG. 6 shows a second perspective view of an exemplary second assembly configuration.

FIG. 6 shows a second perspective view of an exemplary second assembly configuration. The heat sink module 22 is reaching with its cooing ribs 23 through the opening 20 and is accessible for a cooling air stream.

It is appreciated that the first subassembly 27a may have a heat sink module 22 and that the first housing 1a may have a step structure and an opening 20. Hence, the cooling ribs 22 may be accessible for a cooling air stream to dissipate heat from the duplex transceiver module 4.

The modular building technique can be adapted to specific needs related to the optical transmission application. The rigid core unit 28 is preferably utilized for high frequency signal processing where the demands for low processing latency is the primary design requirement. The flexible core unit 29 allows lower assembly precision and lower handling care and is preferably utilized for a low cost variation of an optical transceiver.

First and second subassemblies 27a,b have a first assembly direction 34, which is parallel to the receiving light beam. As a result, the individual modules are simple and easy to manufacture with a high precision.

Figure 7:
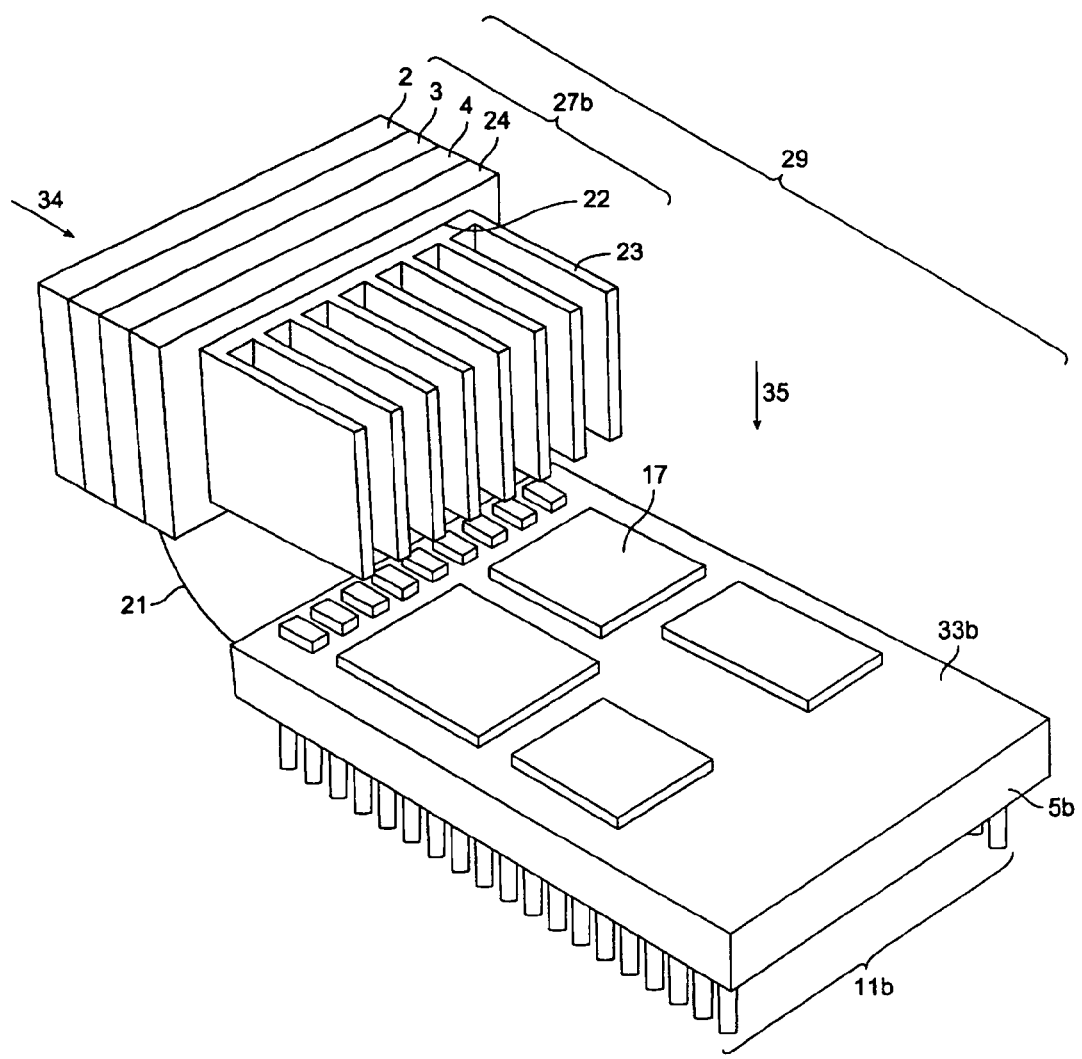
FIG. 7 shows a second perspective view of an exemplary flexible core unit according to the second assembly configuration.
Figure 8:
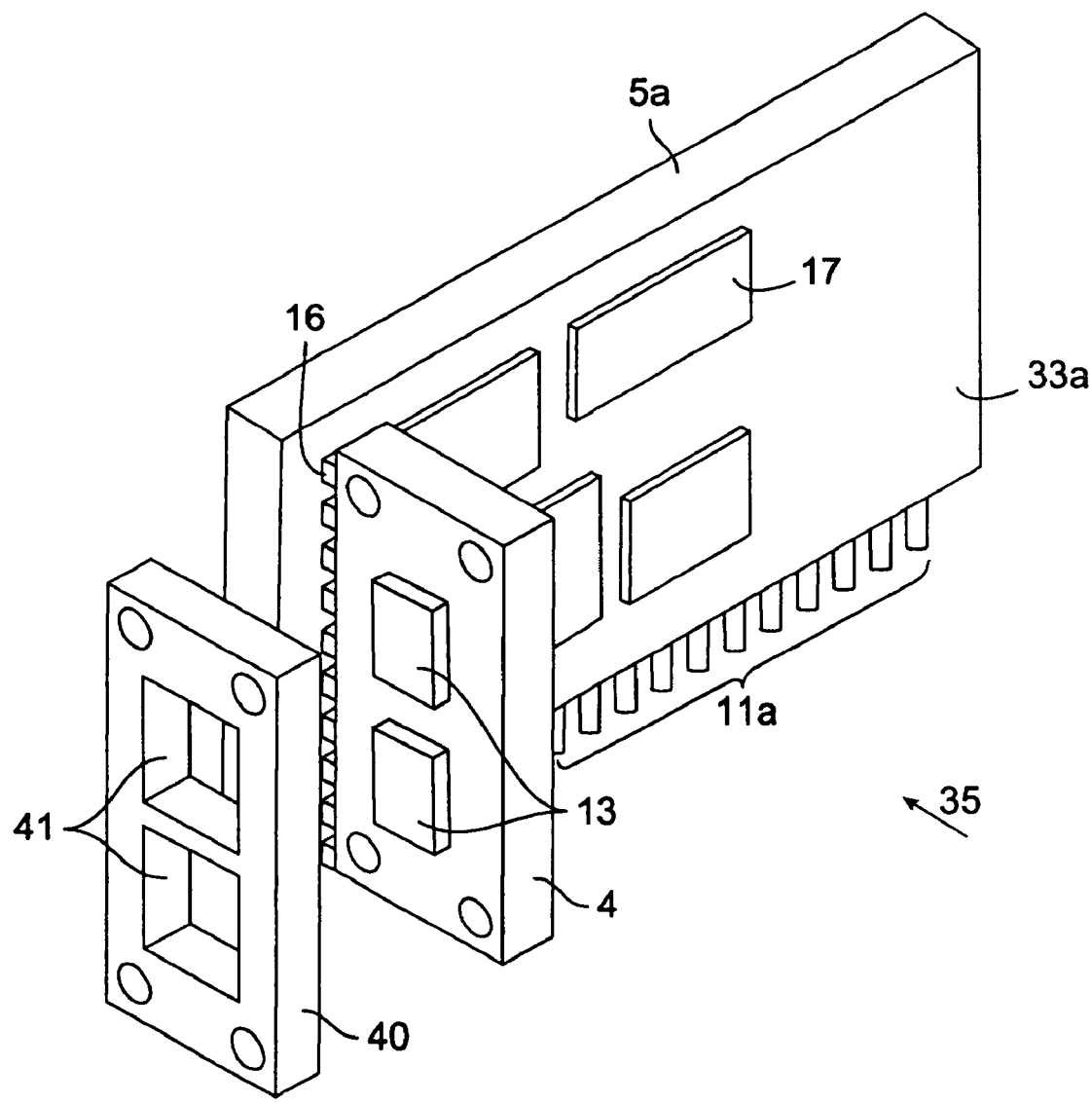
FIG. 8 shows a perspective view of a transceiver module containing optoelectronic devices on its front side, and a faraday shield module containing cavities, in accordance with the exemplary first assembly configuration of FIG. 1.
Figure 9:
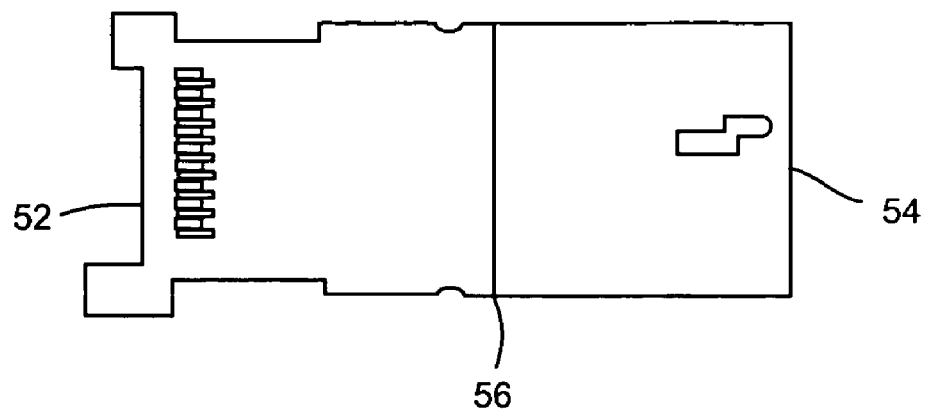
FIG. 9 schematically illustrates a rigid-flex board.

The transceiver boards 5a, 5b—respectively shown in FIGS. 3 and 7—have mainly one second assembly direction 35, which is perpendicular to their respective printed top surfaces 33a, 33b. The chips 17, contact terminals 16, leads (not shown), and other conventional elements of circuit boards are preferably manufactured in the second assembly direction 35.

Thus, the rigid and the flexible core units 28, 29 are mainly fabricated in first and second assembly direction 34, 35, which allow a simple fabrication. The simple fabrication can be adjusted with low effort to the different variations of the invention.

The interchangeable modular devices of the invention can optionally incorporate a faraday module 40 preferably made of copper material. The faraday module 40 provides enclosed cavities 41 in corresponding shape and position to the optoelectronic circuitry 13 that protrude from the transceiver module 4.

It is appreciated that the first and second subassemblies 27a,b may have additional functional modules providing a conventional feature and/or performing a conventional function.

Figure 10:
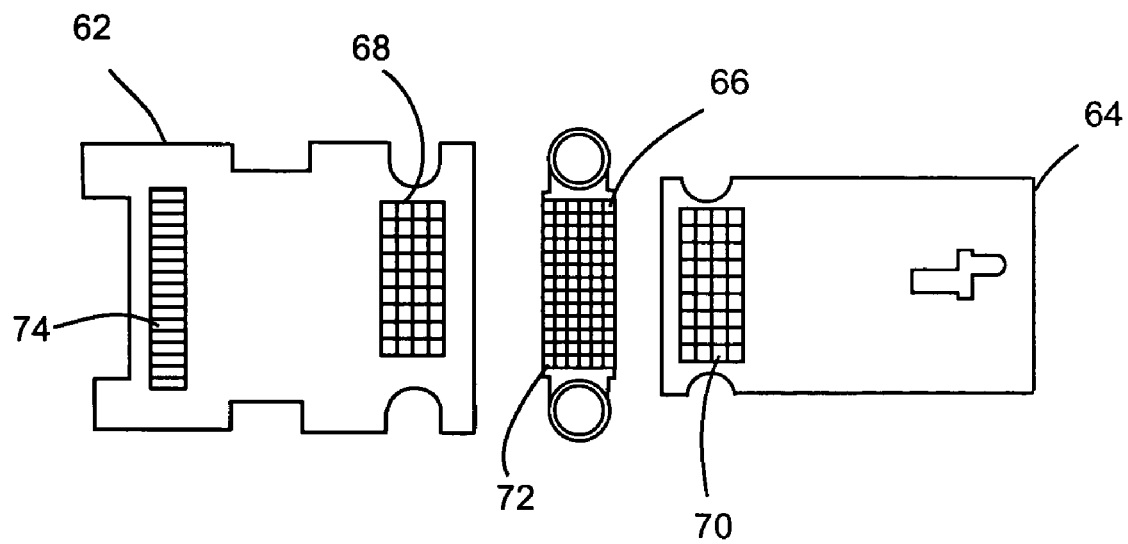
FIG. 10 schematically illustrates three components of an optical transceiver in accordance with a preferred embodiment.

FIG. 10 schematically illustrates a rigid printed circuit board 62, a flex printed circuit board 64 and an interposer 66 or interface connector 66 or rigid-toflex interface connector 66. In the preferred design, the interface connector 66 is an Intercon LGA connector that is preferably used to mechanically connect the rigid board 62 and the flex board 64, and also to connect all of the required signal traces and ground from the flex board 64 to the rigid board 62. A rigid board array 68 of conducting pads, e.g., gold pads, are preferably present on the rigid board 62, and a flex board array 70 of conducting pads, e.g., gold pads, are preferably present on the flex board 64. These arrays 68 and 70 are electrically connected by contact with corresponding interface conducting pads 72 on each side of the interface connector 66. With a stiffener on the flex side, the rigid board 62, the connector 66 and the flex board 64 are held together tight with two screws (see screws 94 at FIG. 13). In an alternative embodiment, the same rigid and flex pad layouts would also allow the use of Ball Grid Array (BGA) or other Area Array Package technology to solder the rigid and flex boards 62, 64 together.

Although not specifically shown in FIG. 10, the flex board preferably has an electro-optical subassembly for converting between electrical signals and modulated optical signals corresponding to the electrical signals. The flex board 64 is adapted for coupling to a fiber optic connector. The rigid board includes an electrical coupling interface 74 for an MDI connector. The interface 74 and other components not specifically shown in FIG. 10 of the rigid and flex boards 62 and 64 are preferably standard or as may be understood by those skilled in the art.

Figure 11:
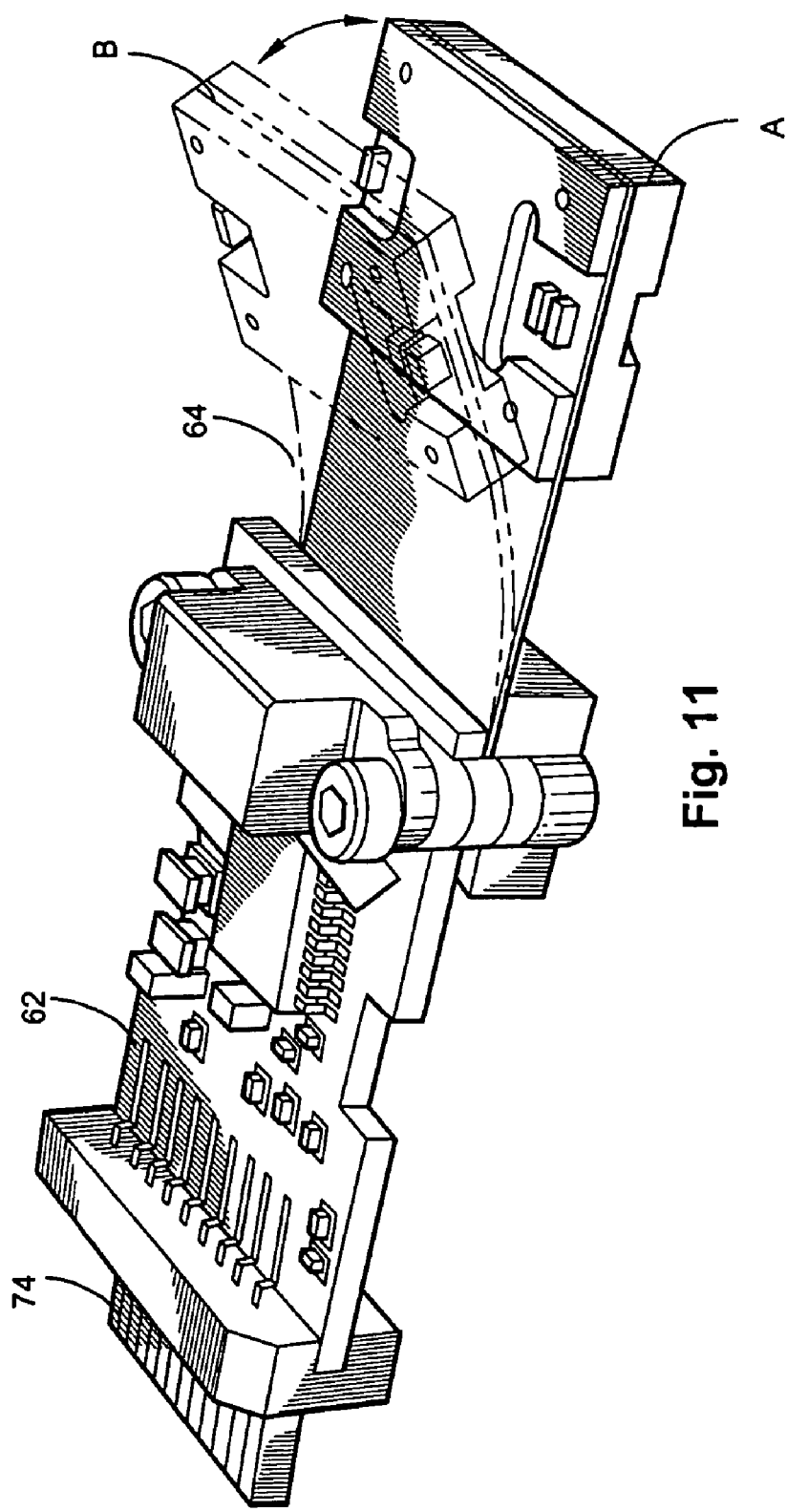
FIG. 11 schematically illustrates a rigid board and a flex board coupled together so that the flex board may be contoured to realize an optical transceiver in accordance with a preferred embodiment.

FIG. 11 schematically illustrates a rigid board 62 and a flex board 64 coupled together so that the flex board 64 may be contoured to realize an optical transceiver shaped in accordance with a preferred embodiment. Of note, the flex board 64 may be contoured as desired to orient the VCSEL array and/or photodetector array on the back surface of the flex substrate 64 orthogonal to the plane of the rigid board 62 and properly directed toward a fiber optic cable connector that is itself directed in the plane of the rigid board 62. FIG. 11 illustrates how the flex substrate may be contoured from an initially horizontal or entirely flat orientation A to a position B having a curvature, or multiple curvatures according to FIG. 12. If an edge-emitting diode array were used, then the light may be emitted orthogonal to that of a VCSEL array, and a flat rigid board may be suitable for use with the housing of FIGS. 1–8 as long as the fiber optic cable is connected at the 2D position within the vertical plane that complements the positioning of the electrical connector interface 74, i.e., with a fully rigid board, there is no ability to adjust the contour and thus the relative positions of the diode array and electrical connector interface 74. Moreover, for different housing-types, it may be possible to make the desired electrical and optical connections with an entirely rigid board or by alternatively contouring the flex board 64, or by manipulating housing configurations and/or cable connector configurations or positions. In addition, a fully flex board would tend to be weak at the end with the electrical connector interface 74 that is desired to be 40 mils thick in accordance with the MDI connector standard.

Figure 12:
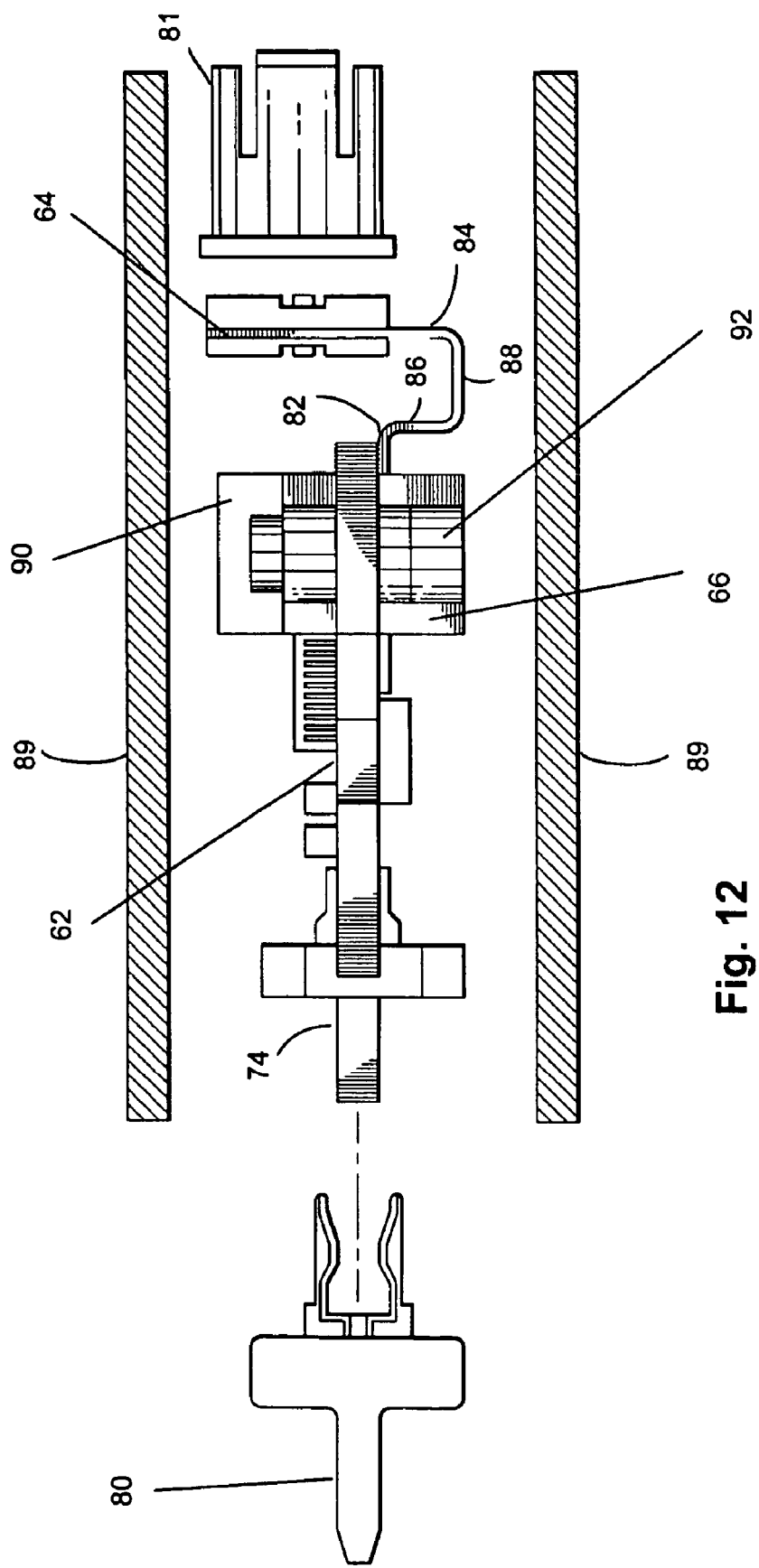
FIG. 12 schematically illustrates an assembled optical transceiver including an electrical connector in accordance with a preferred embodiment.

FIG. 12 schematically illustrates an assembled optical transceiver in accordance with a preferred embodiment. Although the electrical connector 80 is not part of the optical transceiver when assembled into the housing 89 (see FIG. 14), the electrical connector 80 is shown on the left in FIG. 12 for perspective as it is the external component that ultimately makes an electrical connection with the electrical coupling interface 74 of the optical transceiver (see also FIG. 10). The flex substrate 64 is contoured, as desired, so that a VCSEL array and/or photodetector thereon, that transmits and/or receives optical signals in a direction normal to the plane of the flex substrate 64, may form an optical coupling with a fiber optic cable connector 81. That is, a rigid-to-flex interface coupling portion 82 is shown horizontally oriented in FIG. 12, while an optical coupling portion 84 is shown vertically oriented.

Although in operation the rigid-to-flex interface coupling portion 82 and the optical coupling portion 84 of the flex substrate 64 may be variously oriented, these portions 82 and 84 are preferably approximately relatively orthogonally oriented, or at least at some desired acute or obtuse angle greater than 0°. The portions 82 and 84 may also be relatively oriented so that the optical coupling portion 84 of the flex substrate 64 is curved downward in FIG. 12, or so that the angle is 270°, or another angle above 180°. In the preferred embodiment illustrated at FIG. 12, a third portion 86 of the flex substrate 64 is contoured opposite to the optical coupling portion 84. A fourth portion 88 is curved back to approximately 0° or parallel to the rigid-to-flex interface coupling portion 82 of the flex substrate 64. Then, the optical coupling portion 84 is curved opposite to the third portion 86 so that the optical coupling portion 84 and the third portion 86 are anti-parallel and separated by a gap which is the length of the fourth portion 88. The array of VCSELs and/or photodetectors on the flex substrate 64 are then optically directed normal to the plane of the substrate 64 on a front side, whereas the conducting pads 70 (see FIG. 10) are on the back side, or vice-versa (e.g., in FIG. 10, the back side of the flex board 64 is shown).

The advantageous contouring of the flex substrate 64 according to the four portions 82, 84, 86, and 88, permits the entire optical transceiver assembly to fit snugly within a substantially cross-sectionally rectangular housing 89. The walls of the housing 89 are shown displaced from the various components of the transceiver in the illustration of FIG. 12 for observational simplicity, while the actual housing walls (see FIG. 14) couple the transceiver snugly therein.

FIG. 12 further illustrates the coupling of the rigid board 62, the rigid board to flex board interface 66 and the flex board 64. A top mechanical support 90 and a bottom mechanical support 92 are shown sandwiching the boards 62, 64 and the interface 66 that is between the boards 62, 64. Preferably either the supported 90 and 92 contact the walls of the housing 89 to hold the transceiver in place, or couple with the walls of the housing 89 via a spacer or other coupling facilitation component. The electrical connector 80 and optical connector 81 are also preferably coupled in place via left and right vertical, substantially vertical and/or slanted walls that are not shown in FIG. 12 (but see FIG. 14).

Figure 13:
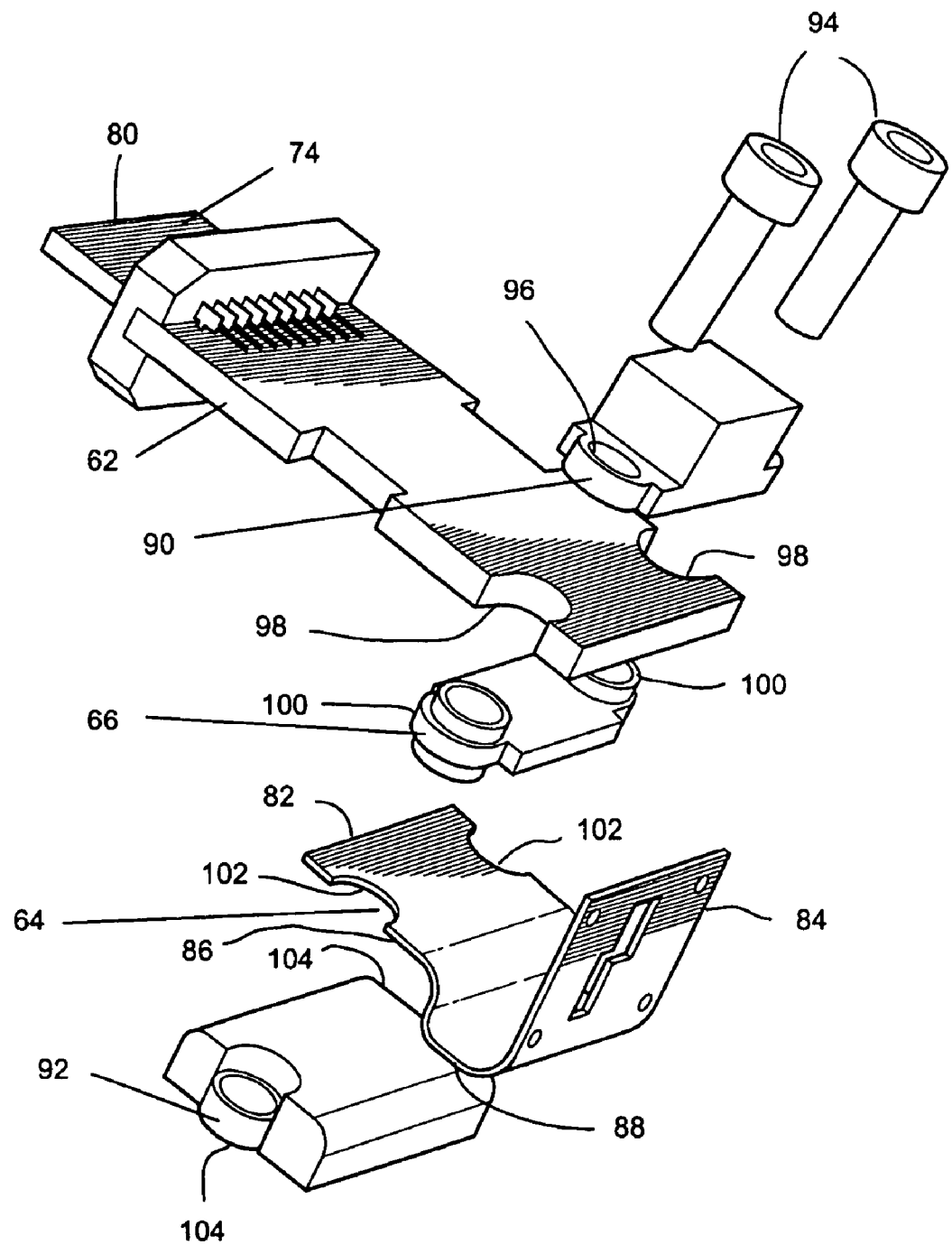
FIG. 13 is an exploded view of the optical transceiver of FIG. 12.

FIG. 13 is an exploded back view of the optical transceiver of FIG. 12. FIG. 13 illustrates an ordering from "top" to "bottom" in sequence of the stack of components coupled together at the interface between the flex board 64 and the rigid board 62. A pair of bolts 94 are shown that insert into apertures 96 in the top mechanical support. The apertures 96 are smooth and not threaded. A pair of partially circular cut-outs 98 defined in the rigid board 62 match up with the apertures 96 and permit the bolts to slide through. The interface 66 also includes apertures 100 that match up with the apertures 96 and cut-outs 98 to permit the bolts to slide through. The apertures 100 are also smooth and not threaded. The coupling portion 82 of the flex substrate 64 also includes a pair of cut-outs 102 that align with the apertures 96 and 100 and the cut-outs 98 of the rigid board 62. Finally, the bottom mechanical support 92 includes a pair of apertures 104 that align up with the apertures 96 and 100 and the cut-outs 98 and 102, so that the bolts secure all of the five components 62, 64, 66, 90 and 92 together. The apertures 104 are preferably threaded to match the bolts, or nuts are provided, or one of various other bolt fastening components are provided in accordance with the bolt configuration as understood by those skilled in the art.

When the bolts 94 are secured, the rigid board 62 is mechanically and preferably electrically coupled with the flex board 64. That is, the opto-electric converter module is preferably on the flex board 64 between the coupling portion 82 and the VCSEL and/or photodetector array, and preferably on the optical coupling portion 84 among the four substantially flat portions 82, 86, 88 and 84 that are preferably consecutively separated by three substantially 90° curvatures. In an alternative embodiment, the rigid-board 62 and the flex board 64 may be optically coupled together, and the opto-electric converter may in this case be on the rigid board 62. In this case, instead of electrically coupling the rigid board 62 with the flex board 64 at the interface 66, an optical waveguide coupler at the interface end of an optical waveguide leading from the opto-electric converter on the rigid board 62 would be coupled with an optical waveguide coupler at the interface end of an optical waveguide of the flex board 64. In this way, optical signals, rather than electrical signals, would be transferred between the rigid and flex boards 62, 64 at the interface 66. The interface 66, in this alternative case, may include apertures, transparent portions or one or more optical waveguide coupling components such as one or more grating couplers or the like, so as not to block, and perhaps to facilitate, the optical signals being transferred.

Figure 14:
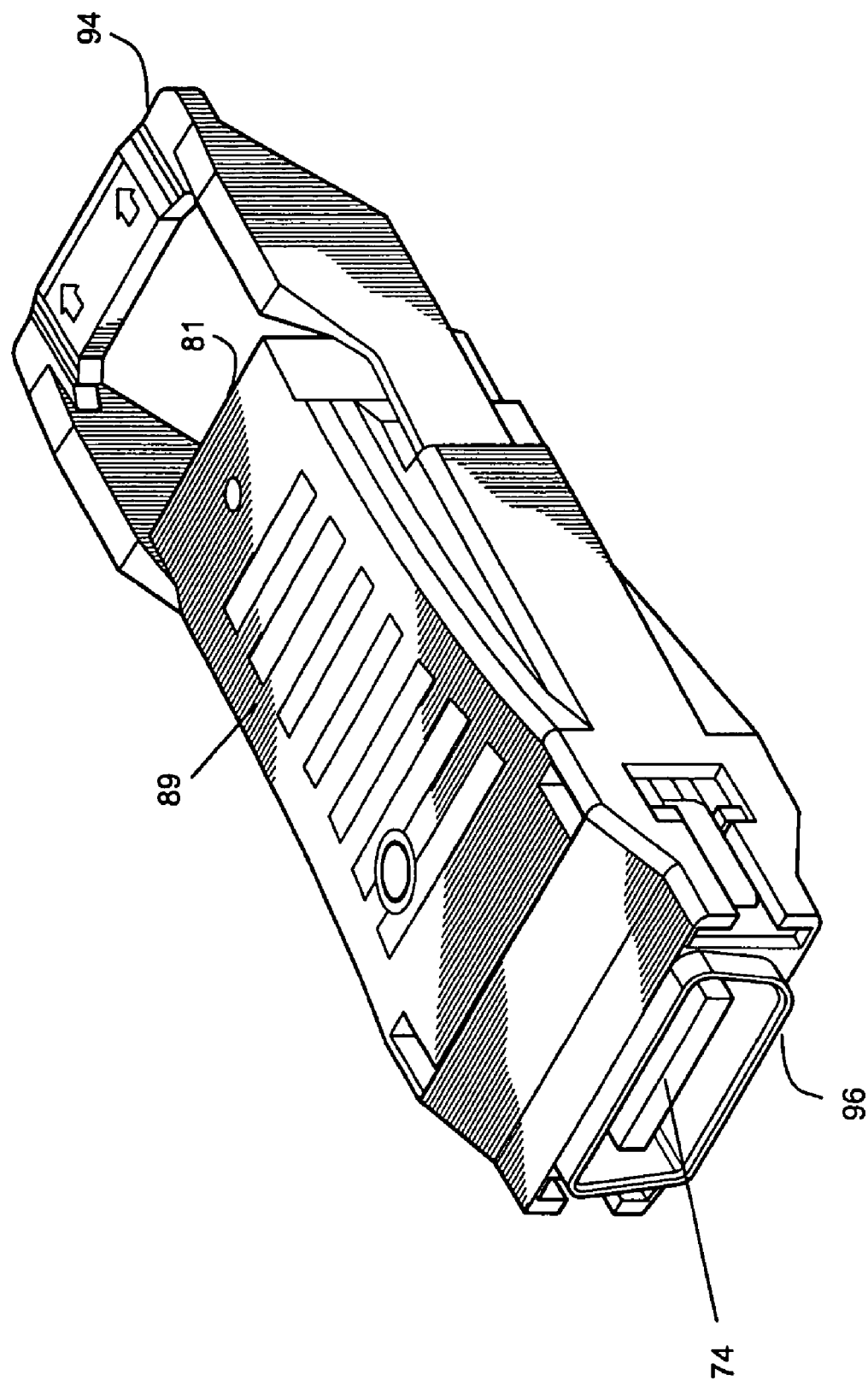
FIG. 14 schematically illustrates in a perspective view a housing for the optical transceiver illustrated at FIGS. 12 and 13.

FIG. 14 schematically illustrates in a perspective view a housing 89 for the optical transceiver illustrated at FIGS. 12 and 13. As mentioned, the rigid board 62, flex board 64, interface 66, and electrical connector 74, illustrated at FIG. 12, are securely coupled within the housing 89 such as by attachment to a wall or walls therein. The connector 81 of FIG. 12 is preferably disposed within the housing 89 for coupling with an external optical cable (not shown). The wing 94 is used for mechanical coupling and stabilizing with an external optical connector module. The electrical connector 74 is shown partially extruding from the housing so that the electrical connector 81 (not shown in FIG. 14, but see FIG. 12) can be coupled to the connector 74 and stabilized by matching the keying structure 96 with a complementary key shape.

In a manufacturing process in accordance with a preferred embodiment, an optical transceiver is manufactured for the purpose of converting and coupling an information-containing electrical signal with an optical fiber. The method includes electrically coupling an electrical signal input/output connection with a rigid printed circuit board, optically coupling an optical signal input/output connection with a flex printed circuit board, and mechanical and information signal coupling the rigid board with the flex board by mechanical coupling each with a rigid-to-flex board interface connector.

The electrical coupling may include coupling a clip or MDI connector to the rigid board. Each of the rigid and flex boards may be signal coupled with the interface connector for transferring signals between the rigid and flex boards. The flex board may be optically coupled with an optical connector of a housing containing the flex board. The method may further include coupling top and bottom mechanical support blocks with the rigid and flex boards and the connector interface. The rigid-to-flex interface connector may have defined therein two or more apertures for receiving corresponding bolts, and the rigid and flex boards may have defined therein matching cut-outs. When the rigid and flex boards are coupled together, the interface may be disposed between them, and the rigid and flex boards and the interface may all be disposed between the top and bottom mechanical couplings. The information signals that are transferable between the rigid and flex boards may be preferably electrical signals, and the flex board may include an electro-optic converter thereon.

In addition to that which is described as background and the invention summary, the following references are hereby incorporated by reference into the detailed description of the preferred embodiments, as disclosing alternative embodiments of elements or features of the preferred embodiments not otherwise set forth in detail below: U.S. Pat. Nos. 6,583,902 and all of the references cited therein, 5,940,562, 4,373,777, 4,461,537, 4,767,179, 4,985,805, 5,280,191, 5,513,073, 5,420,954, 5,631,988, 5,611,013, 5,574,814, 5,047,835, and 5,879,173, and U.S. published applications Nos. 2003/0053762, 2004/0047637 and 2004/0047570.

While an exemplary drawing and specific embodiments of the present invention have been described and illustrated, it is to be understood that that the scope of the present invention is not to be limited to the particular embodiments discussed. Thus, the embodiments shall be regarded as illustrative rather than restrictive, and it should be understood that variations may be made in those embodiments by workers skilled in the arts without departing from the scope of the present invention.

What is claimed is:

1. An optical transceiver for converting and coupling an information-containing electrical signal with an optical fiber comprising:
    a housing including a fiber optic connector adapted for coupling with an external optical fiber for transmitting and/or receiving an optical communications signal;
    a rigid printed circuit board in the housing including an electrical connector for coupling with an external electrical cable or information system device and for transmitting and/or receiving an information-containing electrical communications signal, and a first interface connector for receiving or transferring the electrical signal;
    a flexible printed circuit board in the housing and coupled to the rigid printed circuit board, including a second interface connector for mating with the first interface connector and transmitting or receiving the electrical signal to or from the rigid printed circuit board, and an electro-optical subassembly for converting between an electrical signal and a modulated optical signal corresponding to the electrical signal and adapted for coupling to the fiber optic connector;
    an interposer sandwiched between the first interface connector and second interface connector; and
    first and second mechanical supports disposed on opposite sides of the sandwich, the sandwich of the first interface connector, the interposer and second interface connector being clamped together by the first and second mechanical supports to form a connection between a set of traces of the rigid printed circuit board and respective traces of the flexible board.

2. The module of claim 1, wherein the electrical connector is a media dependent interface (MDI) connector.

3. The module of claim 1, wherein the first interface connector is further used for signal coupling with and transferring electrical signals between each of the rigid and flexible boards.

4. The module of claim 1, wherein the interposer further comprises a rigid-to-flex interface connector with top and bottom mechanical support blocks, and wherein the rigid-to-flex interface connector includes two or more apertures for receiving corresponding bolts, wherein when the rigid and flexible boards are coupled together, the interface is disposed between them, and the rigid and flexible boards and the interface are all disposed between the top and bottom mechanical couplings.

5. An optical transceiver for converting and coupling an information-containing electrical signal with an optical fiber comprising:
    a housing including a fiber optic connector adapted for coupling with an external optical fiber for transmitting or receiving, or both, optical communications signals;
    a rigid printed circuit board in the housing including an electrical connector for coupling with an external electrical cable or information system device, or both, and for transmitting or receiving, or both, an information-containing electrical communications signal;
    a first interface connector coupled with the rigid printed circuit board for receiving or transferring the electrical signal; and
    a flexible printed circuit board in the housing and coupled to the rigid printed circuit board via the first interface connector for transmitting or receiving, or both, electrical signals to or from, or both, the rigid printed circuit board, the flexible board including an electro-optical subassembly for converting between said electrical signals and modulated optical signals corresponding to the electrical signals and adapted for coupling to the fiber optic connector, wherein the first interface connector is sandwiched between the rigid printed circuit board and flexible board; and
    first and second mechanical supports disposed on opposite sides of the sandwich and wherein the sandwich of the rigid printed circuit board, the interface connector and the flexible board are clamped together by the first and second mechanical supports to form a connection between a set of traces of the rigid printed circuit board and respective traces of the flexible board.

6. The module of claim 5, wherein the electrical connector is a media dependent interface (MDI) connector.

7. The module of claim 5, wherein the first interface connector is further used for signal coupling with and transferring electrical signals between each of the rigid and flexible boards.

8. The module of claim 5, wherein the first interface connector further comprises a rigid-to-flex interface connector with top and bottom mechanical support blocks, and wherein the rigid-to-flex interface connector includes two or more apertures for receiving corresponding bolts, wherein when the rigid and flexible boards are coupled together, the interface is disposed between them, and the rigid and flexible boards and the interface are all disposed between the top and bottom mechanical couplings.

9. An optical transceiver module for being disposed within a housing for converting and coupling an information-containing electrical signal with an optical fiber, comprising:
    a rigid printed circuit board for electrical coupling with an electrical signal input/output connection;
    a rigid-to-flex board interface connector mechanically coupled with the rigid board; and
    a flex printed circuit board also mechanically coupled with the rigid-to-flex board interface, the flex board for optical coupling with an optical signal input/output connection, and wherein the mechanical couplings of the rigid and flex boards with the interface connector are such that information signals are transferable between them wherein the rigid-to-flex board interface is sandwiched between the rigid board and flex printed circuit board; and
    first and second mechanical supports disposed on opposite sides of the sandwich and wherein the sandwich of the rigid printed circuit board, the rigid-to-flex board interface and flex printed circuit board are clamped together by the first and second mechanical supports to form a connection between a set of traces of the rigid printed circuit board and respective traces of the flexible board.

10. The module of claim 9, wherein the electrical signal input/output connection is a media dependent interface (MDI) connector.

11. The module of claim 9, wherein the rigid-to-flex interface connector is further used for signal coupling with and transferring signals between each of the rigid and flex boards.

12. The module of claim 9, further comprising a housing including an optical connector for a fiber optic cable, and wherein the optical coupling of the flex board includes coupling with the optical connector of the housing.

13. The module of claim 9, further comprising top and bottom mechanical support blocks, and wherein the rigidt-of-lex interface connector includes two or more apertures defined therein for receiving corresponding bolts, and the rigid and flex board have defined therein matching cut-outs, wherein when the rigid and flex boards are coupled together, the interface is disposed between them, and the rigid and flex boards and the interface are all disposed between the top and bottom mechanical couplings.

14. The module of claim 9, wherein the information signals that are transferable between the rigid and flex boards are electrical signals, and wherein the flex board includes an electro-optic converter thereon.

* * * * *